(12) United States Patent
Chang et al.

(10) Patent No.: US 10,163,801 B2
(45) Date of Patent: Dec. 25, 2018

(54) STRUCTURE AND FORMATION METHOD OF CHIP PACKAGE WITH FAN-OUT STRUCTURE

(71) Applicant: Taiwan Semiconductor Manufacturing Co., Ltd., Hsinchu (TW)

(72) Inventors: Chih-Horng Chang, Taipei (TW); Tin-Hao Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 13 days.

(21) Appl. No.: 15/293,577

(22) Filed: Oct. 14, 2016

(65) Prior Publication Data

US 2018/0108614 A1   Apr. 19, 2018

(51) Int. Cl.

| H01L 33/48 | (2010.01) |
| H01L 23/538 | (2006.01) |
| H01L 21/48 | (2006.01) |
| H01L 21/56 | (2006.01) |
| H01L 23/00 | (2006.01) |
| H01L 21/683 | (2006.01) |
| H01L 23/31 | (2006.01) |

(52) U.S. Cl.
CPC ........ *H01L 23/5386* (2013.01); *H01L 21/486* (2013.01); *H01L 21/4857* (2013.01); *H01L 21/561* (2013.01); *H01L 21/566* (2013.01); *H01L 21/6835* (2013.01); *H01L 23/5383* (2013.01); *H01L 23/5384* (2013.01); *H01L 23/5389* (2013.01); *H01L 24/04* (2013.01); *H01L 24/19* (2013.01); *H01L 21/568* (2013.01); *H01L 23/3128* (2013.01); *H01L 2221/68345* (2013.01); *H01L 2221/68359* (2013.01); *H01L 2221/68372* (2013.01); *H01L 2221/68381* (2013.01); *H01L 2224/18* (2013.01)

(58) Field of Classification Search
CPC .............................. H01L 33/48; H01L 28/84
See application file for complete search history.

(56) References Cited

U.S. PATENT DOCUMENTS

| 5,705,082 A * | 1/1998 | Hinson ..................... C23F 1/02 216/100 |
| 8,361,842 B2 | 1/2013 | Yu et al. |
| 8,680,647 B2 | 3/2014 | Yu et al. |

(Continued)

*Primary Examiner* — Jae Lee
(74) *Attorney, Agent, or Firm* — Birch, Stewart, Kolasch & Birch, LLP

(57) ABSTRACT

Structures and formation methods of a chip package are provided. The chip package includes a semiconductor die having a conductive feature and a protection layer surrounding the semiconductor die. The chip package also includes a dielectric layer arranged over the semiconductor die and the protection layer and partially covering the conductive feature. The conductive feature is arranged accessibly from the protection layer and the dielectric layer. The chip package further includes a conductive layer penetrating through the dielectric layer and electrically connected to the conductive feature of the semiconductor die. The conductive feature has a first portion covered by the dielectric layer and a second portion accessibly exposed from the dielectric layer, and the second portion has a surface roughness greater than that of the first portion.

20 Claims, 19 Drawing Sheets

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2009/0246462 A1* | 10/2009 | Jomaa .................... H05K 3/387 428/141 |
| 2011/0291288 A1 | 12/2011 | Wu et al. |
| 2012/0001328 A1* | 1/2012 | Chang ................. H01L 23/3128 257/738 |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2013/0344627 A1* | 12/2013 | Kim ........................ H01L 24/94 438/15 |
| 2014/0071639 A1* | 3/2014 | Honjo .................. H05K 3/4069 361/751 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0013142 A1* | 1/2016 | Maeda .................... H01L 24/05 257/751 |
| 2016/0035666 A1* | 2/2016 | Huang .................. H01L 21/565 257/666 |

\* cited by examiner

STRUCTURE AND FORMATION METHOD OF CHIP PACKAGE WITH FAN-OUT STRUCTURE

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. One smaller type of packaging for semiconductor devices is a chip-scale package (CSP), in which a semiconductor die is placed on a substrate.

New packaging technologies have been developed to further improve the density and functions of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
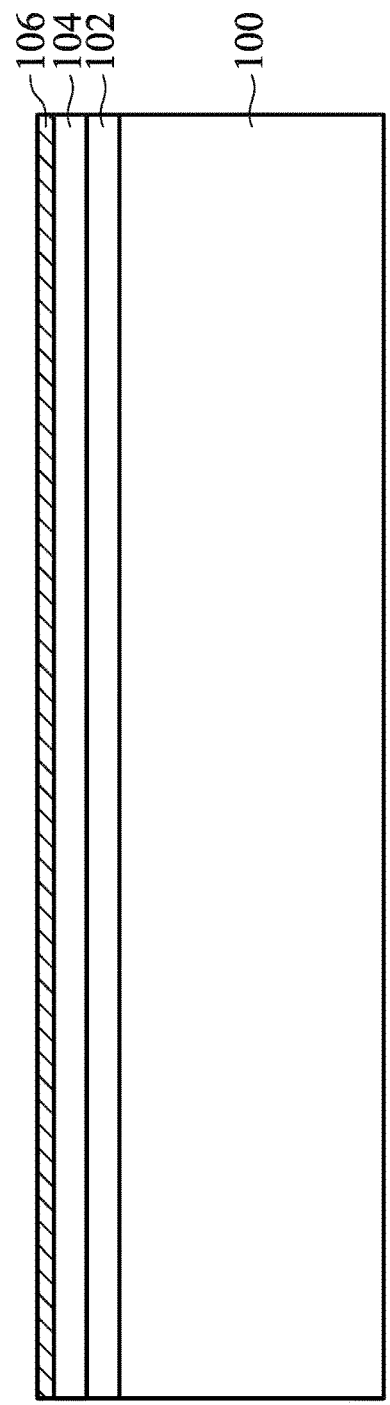
FIGS. 1A-1I are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1I are cross-sectional views of various stages of a process for forming a chip package, in accordance with some embodiments. As shown in FIG. 1A, an adhesive layer 102 and a base layer 104 are deposited or laminated over a carrier substrate 100, in accordance with some embodiments. In some embodiments, the carrier substrate 100 is used as a temporary support substrate. The carrier substrate 100 may be made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

The adhesive layer 102 may be made of glue, or may be a lamination material, such as a foil. In some embodiments, the adhesive layer 102 is photosensitive and is easily detached from the carrier substrate 100 by light irradiation. For example, shining ultra-violet (UV) light or laser light on the carrier substrate 100 is used to detach the adhesive layer 102. In some embodiments, the adhesive layer 102 is a light-to-heat-conversion (LTHC) coating. In some other embodiments, the adhesive layer 102 is heat-sensitive. The adhesive layer 102 may be detached using a thermal operation.

In some embodiments, the base layer 104 is a polymer layer or a polymer-containing layer. The base layer 104 may be a polybenzoxazole (PBO) layer, a polyimide (PI) layer, a solder resist (SR) layer, an Ajinomoto buildup film (ABF), a die attach film (DAF), another suitable layer, or a combination thereof. In some embodiments, the base layer 104 includes multiple sub-layers. In some other embodiments, the base layer 104 is not formed.

Afterwards, a seed layer 106 is deposited over the base layer 104, as shown in FIG. 1A in accordance with some embodiments. In some embodiments, the seed layer 106 is made of a metal material. The metal material may include Ti, Ti alloy, Cu, Cu alloy, another suitable material, or a combination thereof. In some other embodiments, the seed layer 106 includes multiple sub-layers. In some embodiments, the seed layer 106 is deposited using a physical vapor deposition (PVD) process such as a sputtering process, a chemical vapor deposition (CVD) process, a spin-on process, another applicable process, or a combination thereof.

Many variations and/or modifications can be made to embodiments of the disclosure. In some other embodiments, the seed layer 106 is not formed.

Figure 1B:
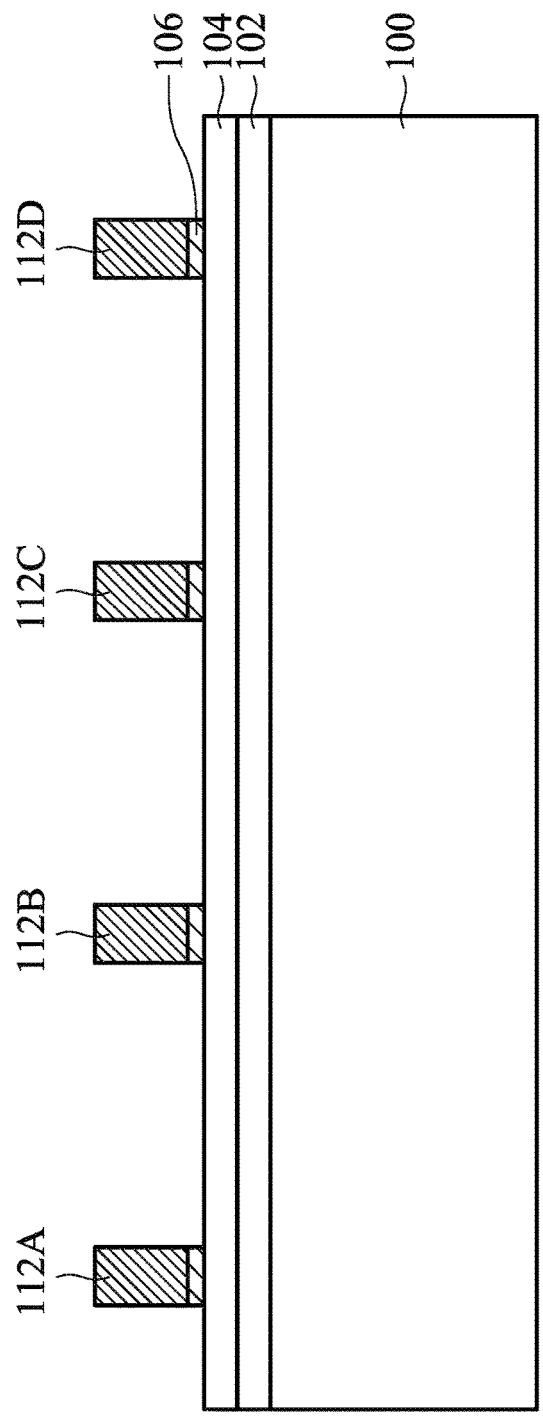

As shown in FIG. 1B, conductive structures including conductive structures 112A, 112B, 112C, and 112D are formed. In some embodiments, the conductive structures 112A, 112B, 112C, and 112D include conductive pillars. In some embodiments, each of the conductive structures 112A, 112B, 112C, and 112D has a linear sidewall.

In some embodiments, a mask layer (not shown) is formed over the seed layer 106 to assist in the formation of the conductive structures 112A-112D. The mask layer has multiple openings that expose portions of the seed layer 106. The openings of the mask layer define the positions where conductive structures will be formed. In some embodiments, the mask layer is made of a photoresist material.

In some embodiments, the conductive structures 112A-112D are made of a metal material. The metal material may include Cu, Ti, Au, Co, Al, W, another suitable material, or a combination thereof. In some embodiments, the conductive structures 112A-112D are made of a solder material that includes Sn. In some other embodiments, the conductive structures 112A, 112B, 112C, and 112D are made of a metal material that does not include Sn.

In some embodiments, the conductive structures 112A, 112B, 112C, and 112D are formed using a plating process. The plating process may include an electroplating process, an electroless plating process, another applicable process, or a combination thereof. However, many variations and/or modifications can be made to embodiments of the disclosure. In some other embodiments, the conductive structures 112A, 112B, 112C, and 112D are formed using a chemical vapor deposition (CVD) process, a physical vapor deposition (PVD) process, a spin-on process, another applicable process, or a combination thereof.

Afterwards, the mask layer is removed, and the portions of the seed layer 106 that are not covered by the conductive structures 112A-112D are removed, as shown in FIG. 1B in accordance with some embodiments. An etching process may be used to partially remove the seed layer 106. The conductive structures 112A-112D may function as an etching mask during the etching of the seed layer 106.

Many variations and/or modifications can be made to embodiments of the disclosure. In some other embodiments, the seed layer 106 and/or the conductive structures 112A-112D are not formed.

Figure 1C:
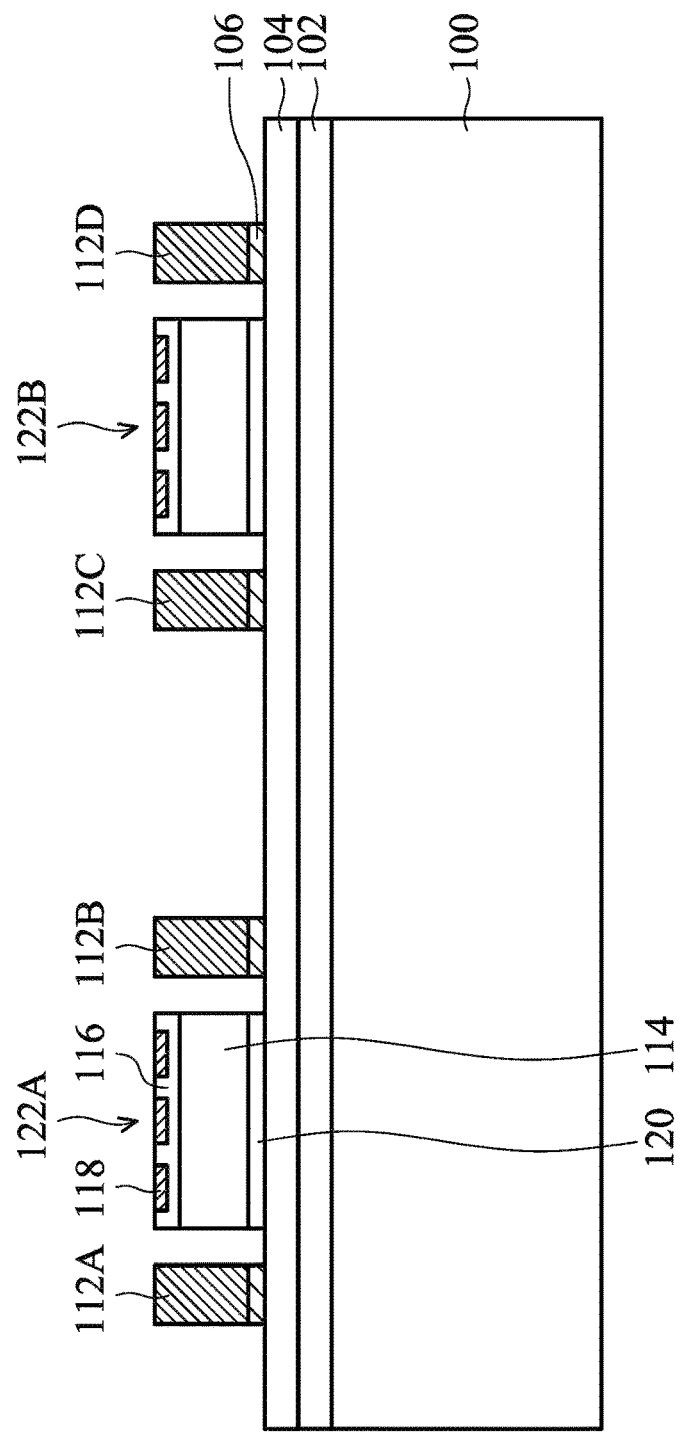

As shown in FIG. 1C, semiconductor dies including semiconductor dies 122A and 122B are attached over the carrier substrate 100, in accordance with some embodiments. In some embodiments, the back sides of the semiconductor dies 122A and 122B face the base layer 104 with the front sides of the semiconductor dies 122A and 122B facing upwards. An adhesive film 120 may be used to affix the semiconductor dies 122A and 122B on the base layer 104. The adhesive film 120 may include a die attach film (DAF), a glue, or another suitable film.

Each of the semiconductor dies 122A and 122B may include a semiconductor substrate 114, a dielectric structure 116, and conductive features 118 at the front side of the semiconductor die. The dielectric structure 116 includes multiple dielectric layers. The conductive features 118 may be conductive pads. In some embodiments, various device elements are formed in the semiconductor substrate 114. Examples of the various device elements include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, or other suitable elements.

The device elements are interconnected to form integrated circuit devices through conductive features formed in the dielectric structure 116. The dielectric structure 116 may include multiple sub-layers. The conductive features may include multiple conductive lines, conductive contacts, and conductive vias. In some embodiments, multiple conductive vias are formed on a top metal line to form electrical connection to one of the conductive features 118. In some embodiments, the conductive features are metal pads which may be made of aluminum or another suitable material.

The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor die 122A or 122B is a system-on-chip (SoC) chip that includes multiple functions.

Figure 1D:
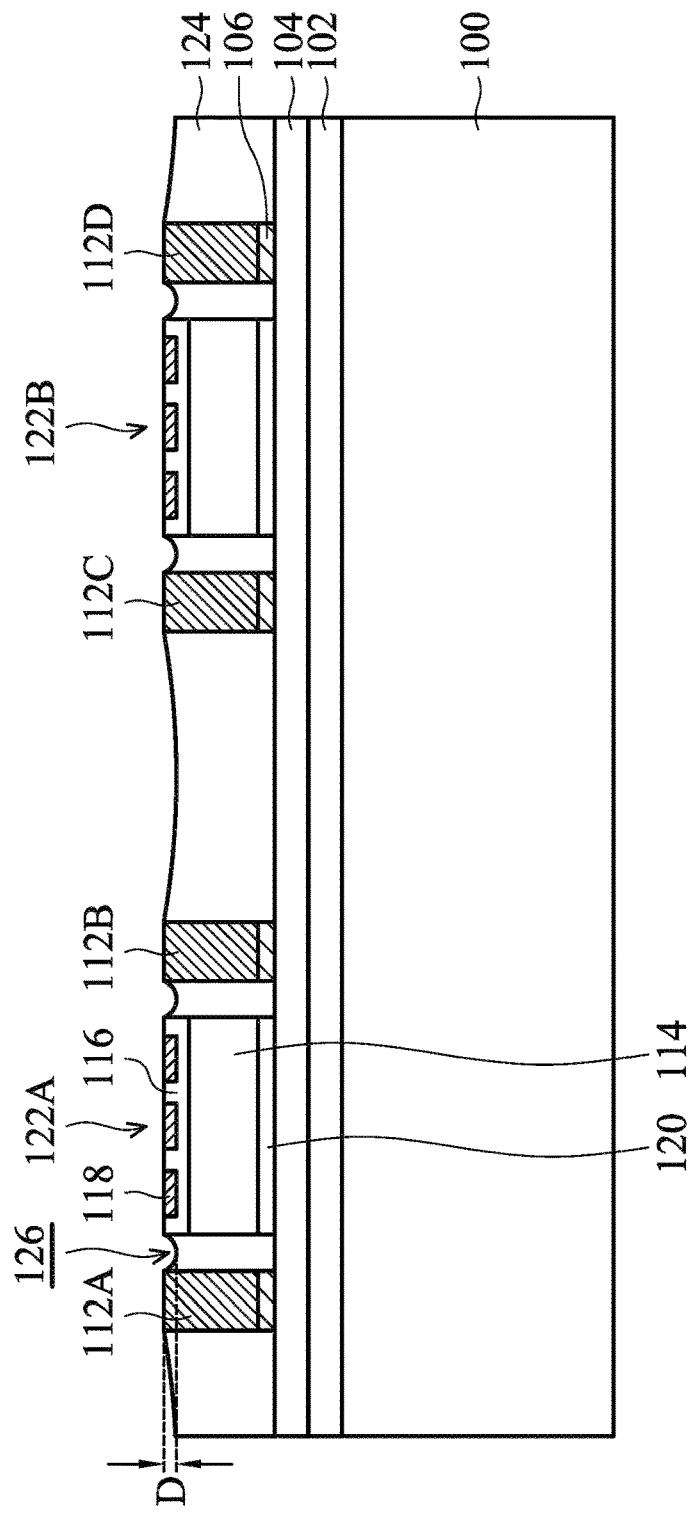

As shown in FIG. 1D, a protection layer 124 is formed over the carrier substrate 100 to surround the conductive structures 112A-112D and the semiconductor dies 122A and 122B, in accordance with some embodiments. In some embodiments, the protection layer 124 covers sidewalls of the conductive structures 112A-112D and the semiconductor dies 122A and 122B.

In some embodiments, the protection layer 124 does not cover the top surfaces of the conductive structures 112A-112D and the semiconductor dies 122A and 122B. In some embodiments, the conductive structures 112A-112D penetrate through the protection layer 124. The conductive structures 112A-112D are used as through package vias (TPVs) or through integrated fan-out vias (TIVs). In some embodiments, the protection layer 124 includes a polymer material. In some embodiments, the protection layer 124 includes a molding compound material. The molding compound material may include an epoxy-based resin with fillers dispersed therein.

In some embodiments, the protection layer 124 is formed by injecting a molding compound material over the carrier substrate 100. In some embodiments, after or during the injecting of the molding compound material, the molding compound material does not cover the top surfaces of the conductive structures 112A-112D and/or the semiconductor dies 122A and 122B.

In some embodiments, a liquid molding compound material is disposed over the carrier substrate 100 to encapsulate the conductive structures 112A-112D and the semiconductor dies 122A and 122B. In some embodiments, a thermal process is then applied to harden the liquid molding compound material and to transform it into the protection layer 124. In some embodiments, the thermal process is performed at a temperature in a range from about 200 degrees C. to about 250 degrees C. The operation time of the thermal process may be in a range from about 0.5 hour to about 3 hours.

Figure 2A:
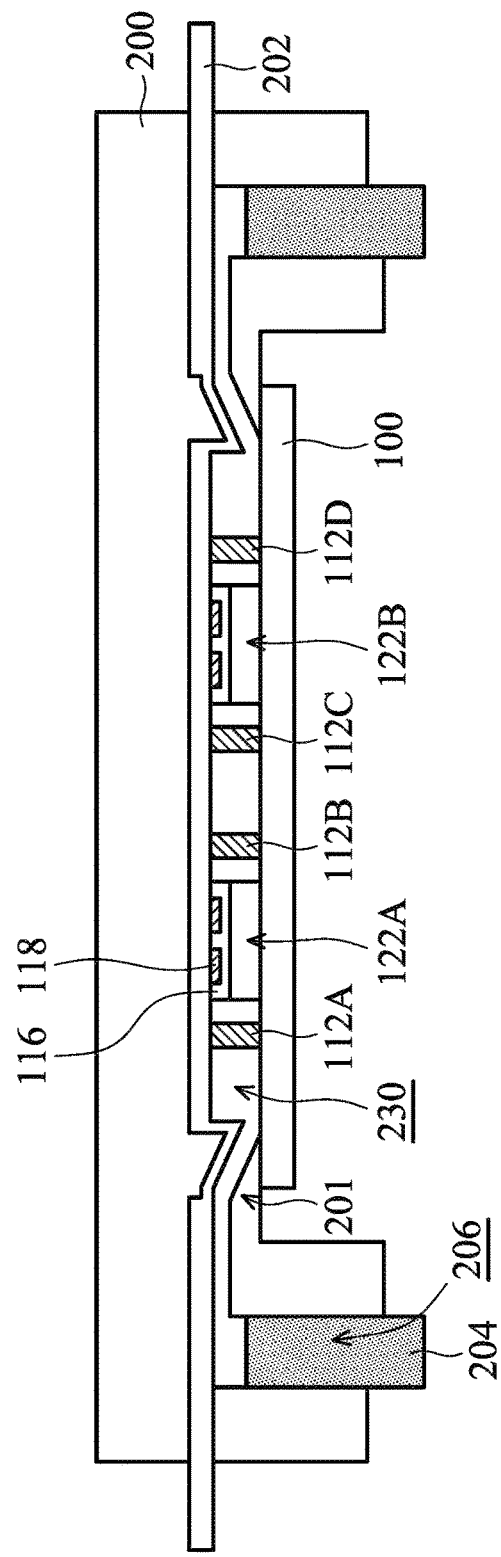
FIGS. 2A-2B are cross-sectional views of various stages of a process for forming a chip package, in accordance with some embodiments.
Figure 2B:
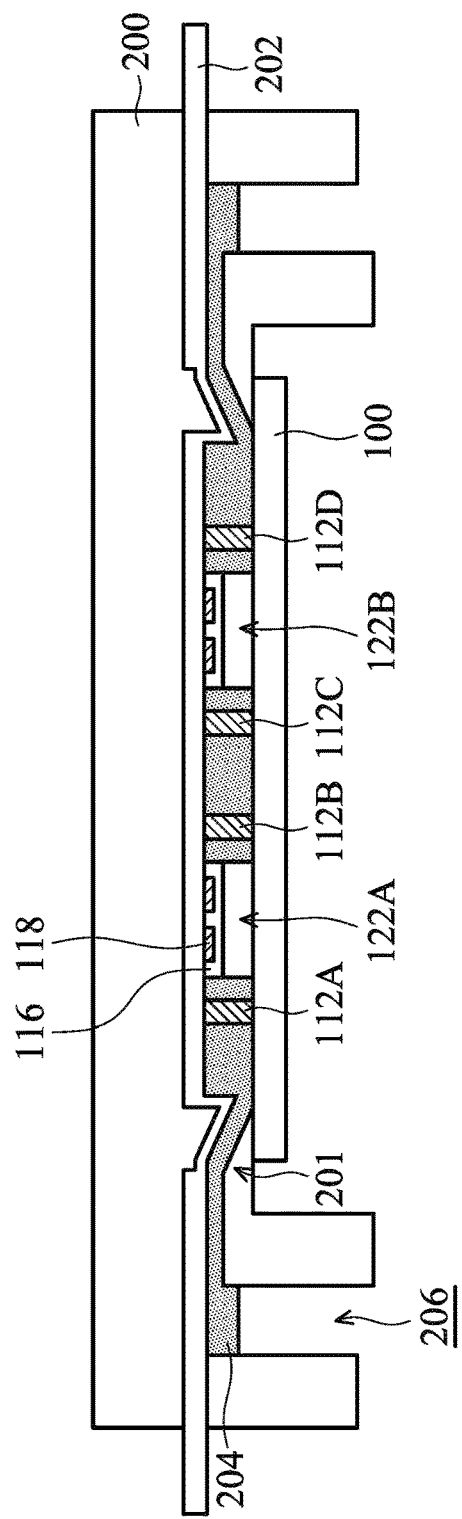

In some embodiments, a mold is used to assist in the formation of the protection layer 124. FIGS. 2A-2B are cross-sectional views of various stages of a process for forming the protection layer 124 of a chip package, in accordance with some embodiments.

As shown in FIG. 2A, a mold 200 is disposed over the carrier substrate 100, in accordance with some embodiments. In some embodiments, a space 230 is formed between the mold 200 and the carrier substrate 100, as shown in FIG. 2A. In some embodiments, the mold 200 includes a sealing element 201. The sealing element 201 may be used to cover the peripheral region of the carrier substrate 100. In some embodiments, the sealing element 201 is a sealing ring. The sealing element 201 may also be used as a settling element that affixes the carrier substrate 100 under the mold 200.

However, many variations and/or modifications can be made to embodiments of the disclosure. In some other embodiments, the sealing element 201 is not formed.

In some embodiments, the mold 200 includes a release film 202. The space 230 is surrounded by the carrier substrate 100, the sealing element 201, and the release film 202. In some embodiments, the release film 202 is made of a material that has a poor adhesion with a molding compound material used for forming the protection layer 124. In some embodiments, the release film 202 is in direct contact with the conductive structures 112A, 112B, 112C, and 112D after the mold 200 is disposed over the carrier substrate 100. In some embodiments, the release film 202 is also in direct contact with the semiconductor dies 122A and 122B.

However, many variations and/or modifications can be made to embodiments of the disclosure. In some other embodiments, the release film 202 is not formed.

In some embodiments, the mold has one or more openings 206. Each of the openings 206 may be used to allow a flow of a molding compound material 204 to be injected into the mold 200. In some embodiments, one or some of the openings 206 are used to allow the flow of the molding compound material 204 to be led out of the mold 200. In some embodiments, each of the openings 206 is used for letting the flow of the molding compound material 204 enter the mold 200. In some other embodiments, the mold 200 has only one opening 206 that allows the flow of the molding compound material 204 to enter the space 230.

Afterwards, the molding compound material 204 is injected into the space 230 between the mold 200 and the carrier substrate 100 until the molding compound material 204 completely fill the space 230, as shown in FIG. 2B, in accordance with some embodiments. The conductive structures 112A-112D are surrounded by the molding compound material 204. The semiconductor dies 122A and 122B are also surrounded by the molding compound material 204, as shown in FIG. 2B in accordance with some embodiments.

In some embodiments, the release film 202 is in direct contact with the conductive structures 112A, 112B, 112C, and 112D during the injecting of the molding compound material 204. In some embodiments, the release film 202 is also in direct contact with the semiconductor dies 122A and 122B during the injecting of the molding compound material 204.

Afterwards, the mold 200 is removed, and the molding compound material 204 is cured to become the protection layer 124, as shown in FIG. 1D in accordance with some embodiments. In some embodiments, the molding compound material 204 is cured after the removal of the mold 200. In some other embodiments, the molding compound material 204 is cured before the removal of the mold 200. In some other embodiments, a first thermal operation is performed before the removal of the mold 200, followed by a second thermal operation performed after the removal of the mold 200. The second thermal operation is used to complete the curing of the molding compound material 204. As a result, the protection layer 124 is formed.

In some embodiments, during the injecting of the molding compound material 204, the molding compound material 204 does not cover the top surfaces of the conducting structures 112A-112D and/or the semiconductor dies 122A and 122B due to the mold 200. As a result, the top surfaces of the conducting structures 112A-112D and the semiconductor dies 122A and 122B are not covered by the protection layer 124, as shown in FIG. 1D. In some embodiments, it is not necessary for the protection layer 124 to be thinned since the conductive structures 112A-112D and the conductive features 118 of the semiconductor dies 122A and 122B have been exposed without being covered by the protection layer 124.

In some other cases, the mold 200 is not used. In these cases, the conductive structures and the semiconductor dies are covered by the molding compound material. Afterwards, a thinning process may need to be performed to thin down the protection layer so as to expose the conductive structures and the conductive features (such as conductive pads) of the semiconductor dies. An additional passivation layer (such as a PBO layer) and conductive pillars that can sustain the thinning process may need to have been formed previously over each of the semiconductor dies to ensure conductive routes to the semiconductor dies. The formation of the additional passivation layer and conductive pillars involves one or more photolithography processes, deposition or plating processes, and etching processes. Fabrication cost and process time are therefore high.

In some embodiments where the mold 200 is used, since no thinning process on the protection layer 124 is required, fabrication cost and process time are reduced. Damage due to the thinning process may also be prevented. In some embodiments, no additional passivation layer or conductive pillars needs to be formed on the semiconductor dies, and so the fabrication cost and process time are reduced further.

In some embodiments, the adhesion between the molding compound material 204 and the release film 202 is poor. Therefore, the molding compound material 204 may be prevented from adhering on the mold 200 during the subsequent removal of the mold 200. After the removal of the mold 200, recesses may be formed at the surface of the molding compound material 204. As a result, there are also some recesses 126 formed at the surface of the protection layer 124 after the molding compound material 204 is cured to form the protection layer 124.

As shown in FIG. 1D, the protection layer 124 has recesses 126, in accordance with some embodiments. Some of the recesses 126 are adjacent to the semiconductor die 122A or 122B. Some of the recesses 126 are between the semiconductor die 122A or 122B and one of the conductive structures 112A, 112B, 112C, and 112D. Some of the recesses 126 are between two of the conductive structures, such as between the conductive structures 112B and 112C. As shown in FIG. 1D, one of the recesses 126 has a depth D. In some embodiments, the depth D is in a range from about 3 μm to about 10 μm. For example, the depth D may be about 7 μm.

In some cases, during the curing of the molding compound material 204, solvent and/or other compound coming from the molding compound material 204 may pollute the surfaces of the conductive structures 112A, 112B, 112C, and 112D and the conductive features 118 of the semiconductor dies 122A and 122B. Some residues may adhere on and cover portions of the surfaces of the conductive structures 112A-112D and the conductive features 118 of the semiconductor dies 122A and 122B. As a result, electrical connection between the conductive features 118 (or the conductive structures 112A-112D) and subsequently formed conductive layers may be negatively affected.

As mentioned above, it may not be necessary for the protection layer 124 to be thinned since the conductive structures 112A-112D and the conductive features 118 have been exposed without being covered by the protection layer 124. Therefore, the residues partially covering the surfaces of the conductive structures 112A-112D and the conductive features 118 may remain since no thinning process is performed. In some other cases where a thinning process is performed to thin down the protection layer to expose the conductive structures 112A-112D and the conductive features 118, the residues may together be removed during the thinning process.

Figure 1E:
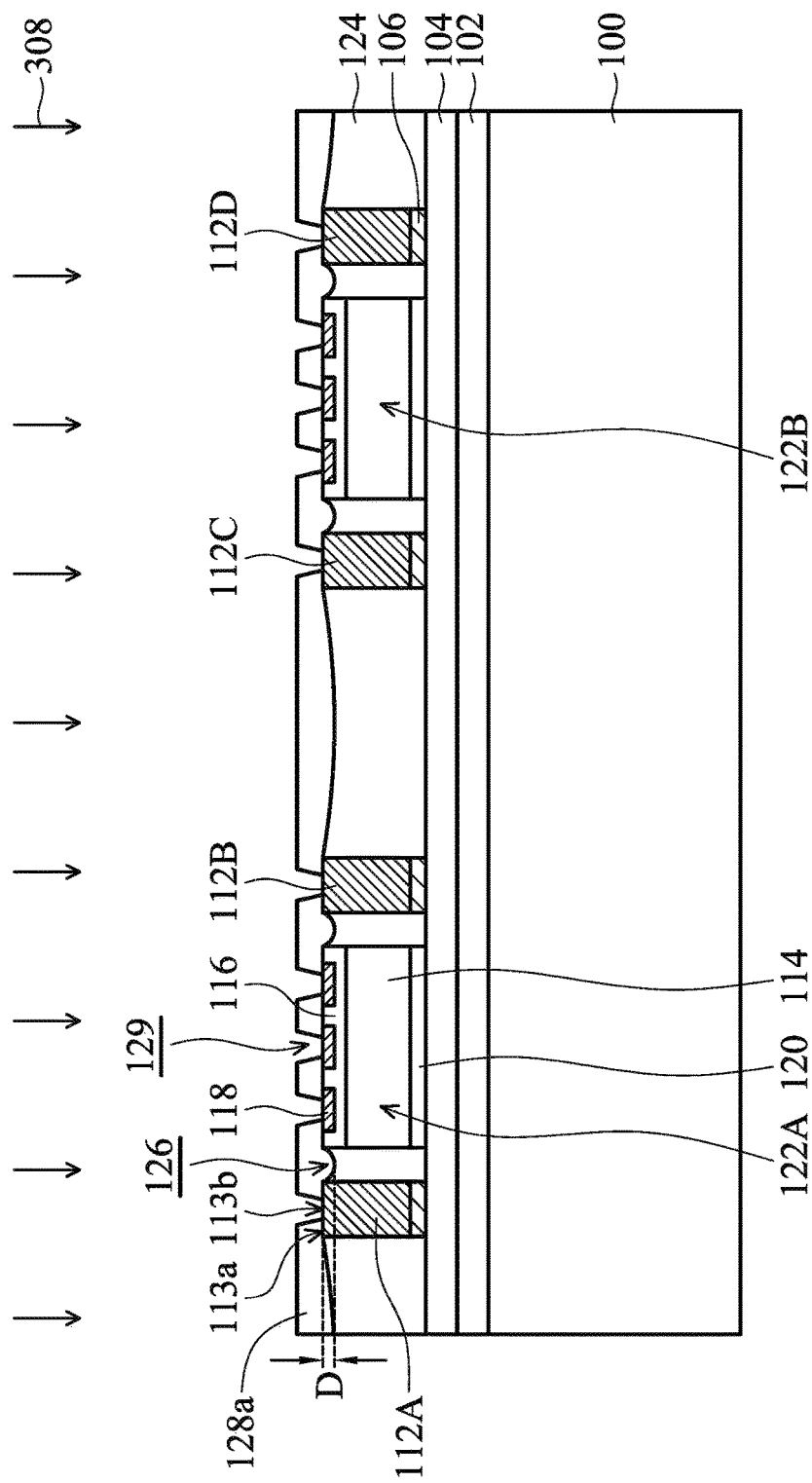

Afterwards, an interconnection structure including multiple dielectric layers and multiple conductive layers is formed over the structure shown in FIG. 1D. As shown in FIG. 1E, a dielectric layer 128a is formed over the protection layer 124, the conductive structures 112A-112D, and the semiconductor dies 122A and 122B. In some embodiments, the dielectric layer 128a fills the recesses 126 of the protection layer 124. In some embodiments, the dielectric layer 128a is made of one or more polymer materials. The dielectric layer 128a may be made of polybenzoxazole (PBO), polyimide (PI), another suitable material, or a combination thereof. In some embodiments, the dielectric layer 128a is formed using a spin coating process, a spray coating process, another applicable process, or a combination thereof.

As shown in FIG. 1E, the dielectric layer 128a is patterned to form multiple openings 129, in accordance with some embodiments. In some embodiments, some of the openings 129 expose the conductive structures 112A-112D. In some embodiments, some of the openings 129 expose the conductive features 118 of the semiconductor dies 122A and 112B. In some embodiments, the openings 129 are formed using a photolithography process, a laser drilling process, another applicable process, or a combination thereof.

As mentioned above, the surfaces of the conductive structures 112A-112D and the conductive features 118 may be partially covered by some residues coming from the molding compound material 204. As shown in FIG. 1E, a cleaning operation 308 is performed to remove the residues and clean the surfaces of the conductive features 118 of the semiconductor dies 122A and 122B. In some embodiments, the surfaces of the conductive structures 112A-112D are also cleaned in the cleaning operation 308.

Figure 1F:
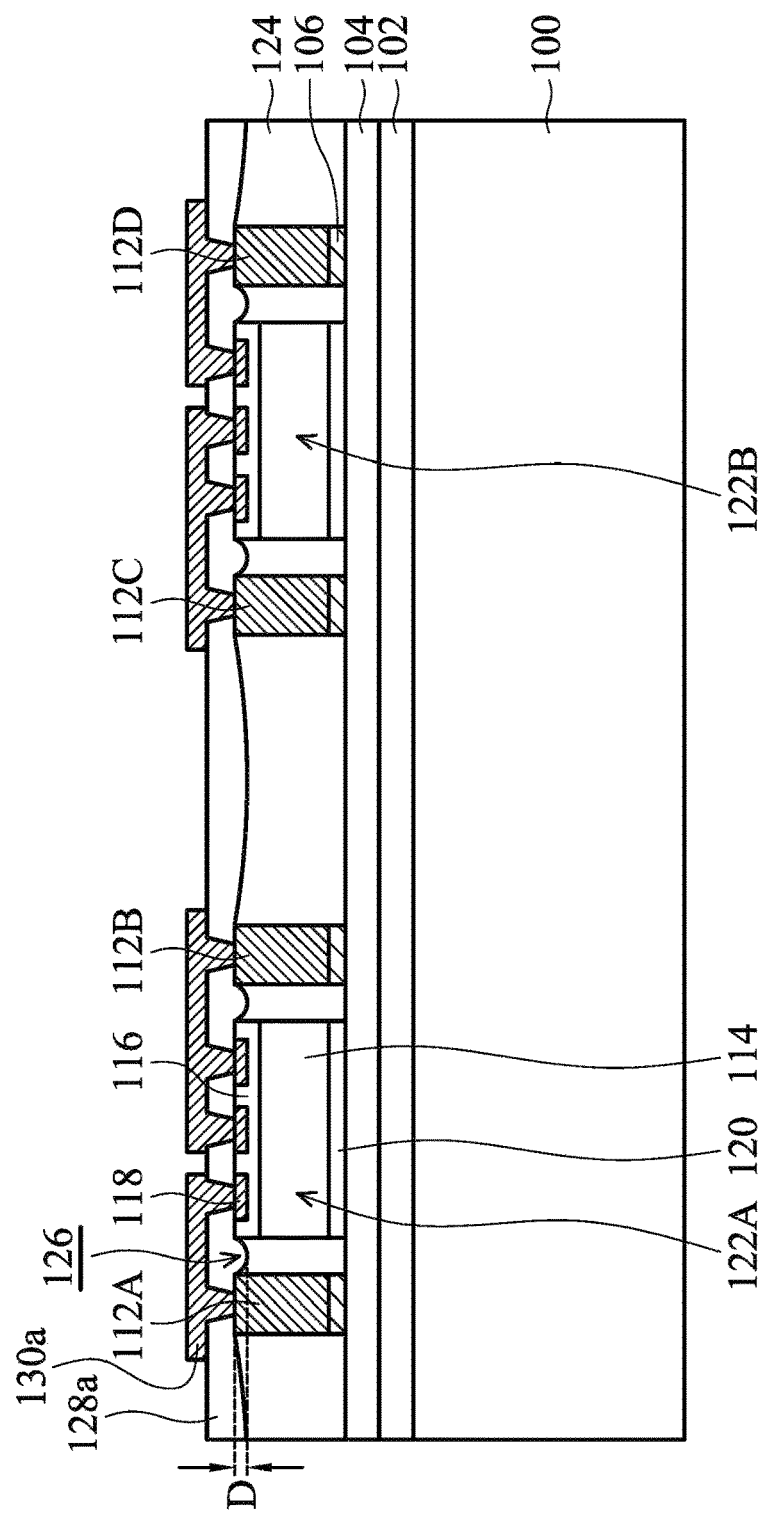

Afterwards, conductive layers 130a are formed over the dielectric layer 128a, as shown in FIG. 1F in accordance with some embodiments. In some embodiments, the conductive layer 130a fills the opening 129. In some embodiments, one of the conductive layers 130a is electrically connected to the conductive structure 112A through one of the openings 129. In some embodiments, one of the conductive layers 130a is electrically connected to the conductive feature 118 (such as a conductive pad) of the semiconductor die 122A through one of the openings 129. In some embodiments, the conductive structure 112A is electrically connected to one of the conductive features 118 of the semiconductor die 122A through one of the conductive layers 130a.

Due to the cleaning operation 308, the residues formed during the formation of the protection layer 124 have been removed. Therefore, there is substantially no remaining residue between the conductive features 118 and the conductive layers 130. Electrical connections between the conductive features 118 and the conductive layers 130 are significantly improved. Similarly, electrical connections between the conductive layers 130 and the conductive structures 112A-112D are also improved.

FIGS. 3A-3E are cross-sectional views of various stages of a process for forming a chip package, in accordance with some embodiments. In some embodiments, FIGS. 3A-3E are enlarged cross-sectional views illustrating the processes illustrated in FIGS. 1D-1F.

Figure 3A:
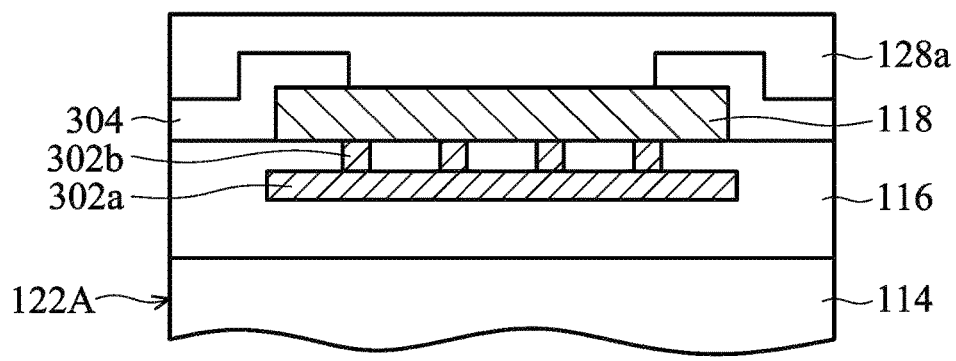
FIGS. 3A-3E are cross-sectional views of various stages of a process for forming a chip package, in accordance with some embodiments.

As shown in FIG. 3A, the semiconductor die 122A includes a passivation layer 304 over the dielectric structure 116, in accordance with some embodiments. The passivation layer 304 partially covers the conductive feature 118, as shown in FIG. 3A. The passivation layer 304 may be made of silicon oxide, silicon oxynitride, silicon carbide, silicon nitride, another suitable material, or a combination thereof. In some embodiments, the passivation layer 304 is formed before the semiconductor die 122A is placed over the carrier substrate 100.

In some embodiments, the conductive feature 118 is a conductive pad that is electrically connected to a conductive line 302a formed in the dielectric structure 116 through conductive vias 302b. The conductive line 302a may be electrically connected to a device element (not shown) formed in the semiconductor substrate 114 through other conductive vias, conductive lines, and/or conductive contacts formed in the dielectric structure 116. In some embodiments, the conductive line 302a is the top conductive line formed in the dielectric structure 116. The conductive line 302a may also be called a top metal.

Figure 3B:
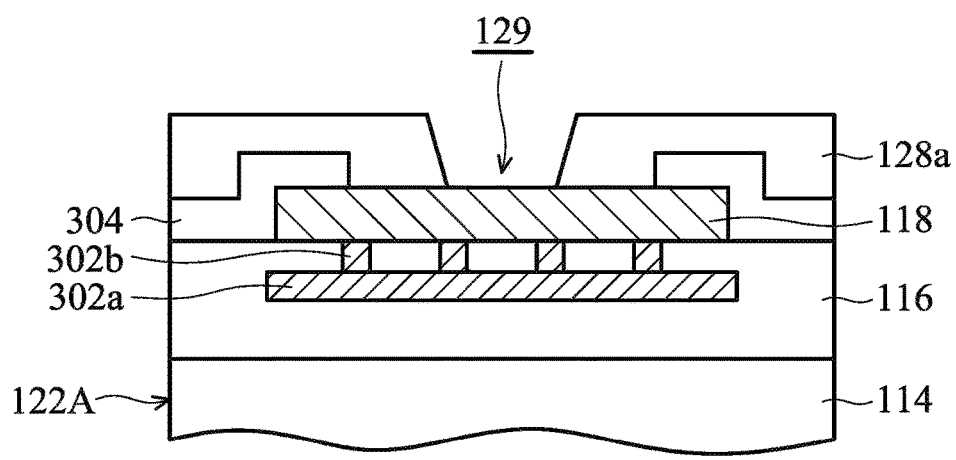

The dielectric layer 128a is then formed over the semiconductor die 122A, as shown in FIG. 3A in accordance with some embodiments. Afterwards, the dielectric layer 128a is patterned to form the openings 129, as shown in FIGS. 3B and 1E in accordance with some embodiments. In FIG. 3B, only one of the openings 129 is shown.

Figure 3C:
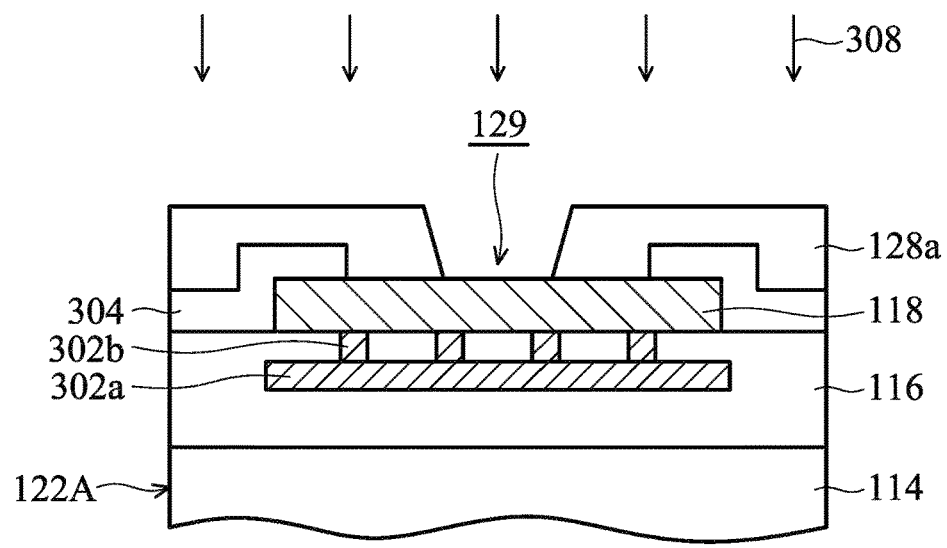

As shown in FIGS. 3C and 1E, the cleaning operation 308 is performed to clean the surfaces of the conductive features 118 and the conductive structures 112A-112D (accessibly) exposed by the openings 129. In some embodiments, the cleaning operation 308 involves applying an acid-containing substance on the (accessibly) exposed surfaces of the conductive features 118 and the conductive structures 112A-112D.

The acid-containing substance may be used to partially remove the conductive features 118 and the conductive structures 112A-112D exposed by the openings 129. As a result, the residues coming from the molding compound material may also be removed by the acid-containing substance. Since the residues are removed, electrical connection between the conductive features 118 (or the conductive structures 112A-112D) and the subsequently formed conductive layer (130a) are improved.

In some embodiments, the acid-containing substance includes an acid-containing solution. In some other embodiments, the acid-containing substance includes an acid-containing gas. In some other embodiments, the acid-containing substance includes a mixture of an acid-containing solution and an acid-containing gas. In some embodiments, the acid-containing substance includes a hydrofluoric acid (HF) solution, an HF gas, a phosphoric acid solution, another suitable substance, or a combination thereof.

In some embodiments, the cleaning operation 308 is performed by applying an acid solution jet on the surfaces of the conductive features 118 and the conductive structures 112A-112D. In some embodiments, the acid solution jet is a dilute hydrofluoric acid solution. The dilute hydrofluoric acid solution may have a volumetric concentration of HF that is in a range from about 0.5% to about 1.5%. For example, a pressurized hydrofluoric acid solution having a volumetric concentration of about 1% is used to clean the surfaces of the conductive features 118 and the conductive structures 112A-112D exposed by the openings 129.

Many variations and/or modifications can be made to embodiments of the disclosure. In some other embodiments, the cleaning operation 308 is performed by dipping the structure shown in FIG. 3C into an acid-containing solution.

In some embodiments, two or more acid-containing substances are used in the cleaning operation 308. In some embodiments, a dilute phosphoric acid solution jet is used first. Afterwards, a dilute hydrofluoric acid solution jet is applied to the surfaces of the conductive features 118 and the conductive structures 112A-112D. In some other embodiments, a hydrofluoric acid solution is mixed with a second solution (such as a phosphoric acid solution) to serve as the acid-containing substance in the cleaning operation 308.

Figure 5A:
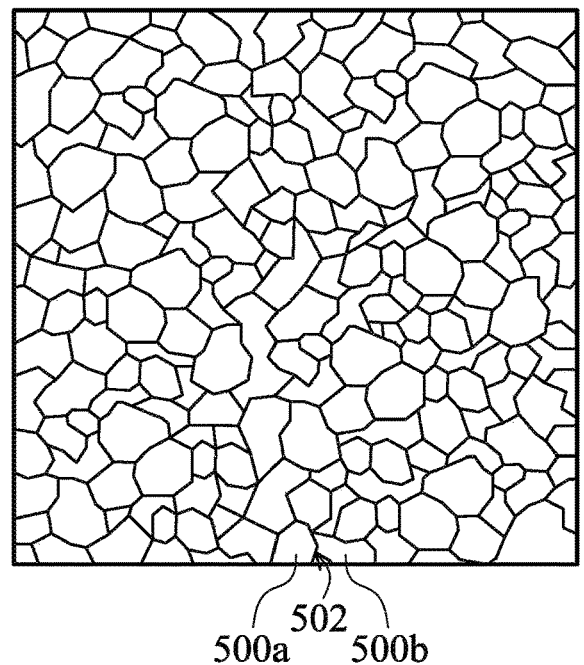
FIG. 5A is a top view of a conductive pad of a chip package, in accordance with some embodiments.
Figure 5B:
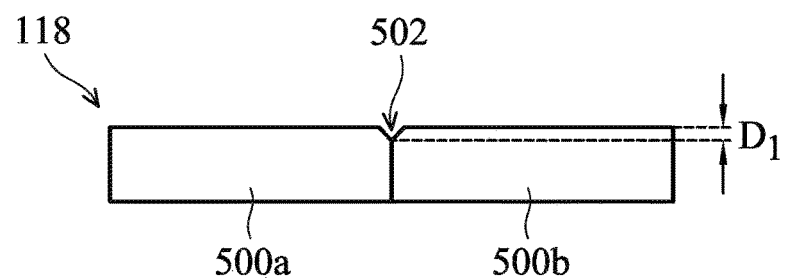
FIG. 5B is a cross-sectional view of a conductive pad of a chip package, in accordance with some embodiments.
Figure 6A:
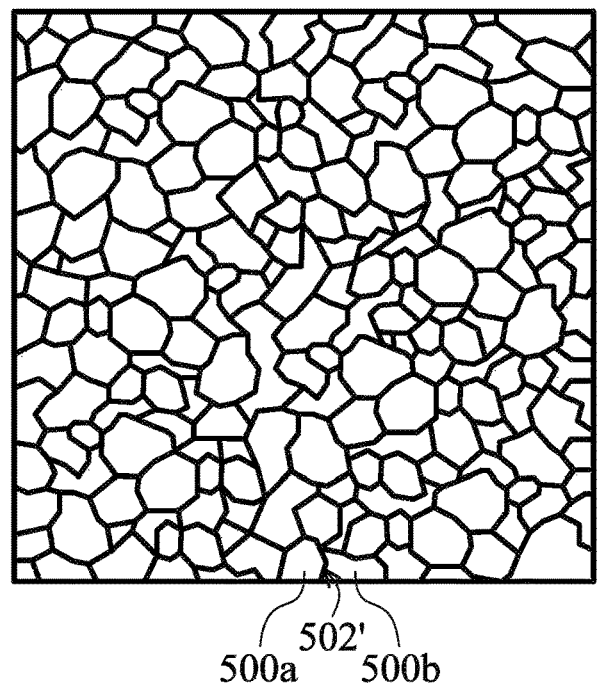
FIG. 6A is a top view of a conductive pad of a chip package, in accordance with some embodiments.
Figure 6B:
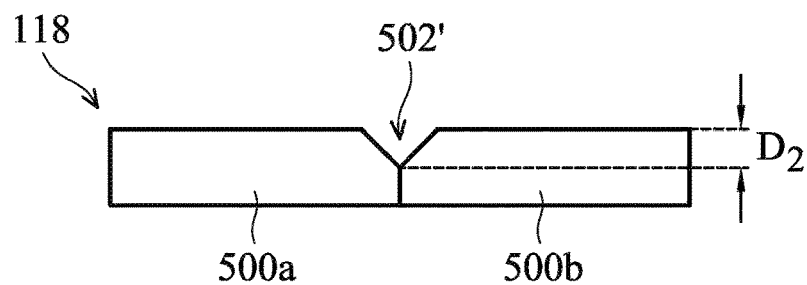
FIG. 6B is a cross-sectional view of a conductive pad of a chip package, in accordance with some embodiments.

After the cleaning operation 308, the microstructure of the cleaned surfaces of the conductive features 118 or the conductive structures 112A-112D are changed. FIG. 5A is a top view of a conductive pad of a chip package, in accordance with some embodiments. FIG. 5B is a cross-sectional view of a conductive pad of a chip package, in accordance with some embodiments. In some embodiments, FIGS. 5A and 5B show the microstructure of a portion of the conductive feature 118 before the cleaning operation 308. FIG. 6A is a top view of a conductive pad of a chip package, in accordance with some embodiments. FIG. 6B is a cross-sectional view of a conductive pad of a chip package, in accordance with some embodiments. In some embodiments, FIGS. 6A and 6B show the microstructure of a portion of the conductive feature 118 after the cleaning operation 308.

As shown in FIGS. 5A and 5B, the conductive feature 118 (such as a conductive pad) includes a number of grains including grains 500a and 500b. As shown in FIGS. 5A and 5B, a grain boundary 502 is between the grains 500a and 500b. In some embodiments, the grain boundary 502 has a depth of $D_1$ (surface grain boundary depth). The depth $D_1$ may be smaller than about 100 nm.

After the cleaning operation 308, a surface portion of the conductive feature 118 is removed. The portion of the conductive feature 118 near the grain boundary 502 may be removed by the acid-containing substance more easily. As shown in FIGS. 6A and 6B, the grain boundary becomes deeper because of the application of the acid-containing substance. Reference number 502' is used to designate the grain boundary that becomes deeper. The grain boundary 502' has a depth of $D_2$ (surface grain boundary depth) that is greater than the depth $D_1$. In some embodiments, the depth $D_2$ is in a range from about 110 nm to about 150 nm.

After the cleaning operation 308, the average depth of grain boundaries of the conductive features 118 (and the conductive structures 112A-112D) becomes deeper. In some embodiments, after the cleaning operation 308, the surface roughness of the conductive features 118 (and the conductive structures 112A-112D) becomes deeper.

Figure 3D:
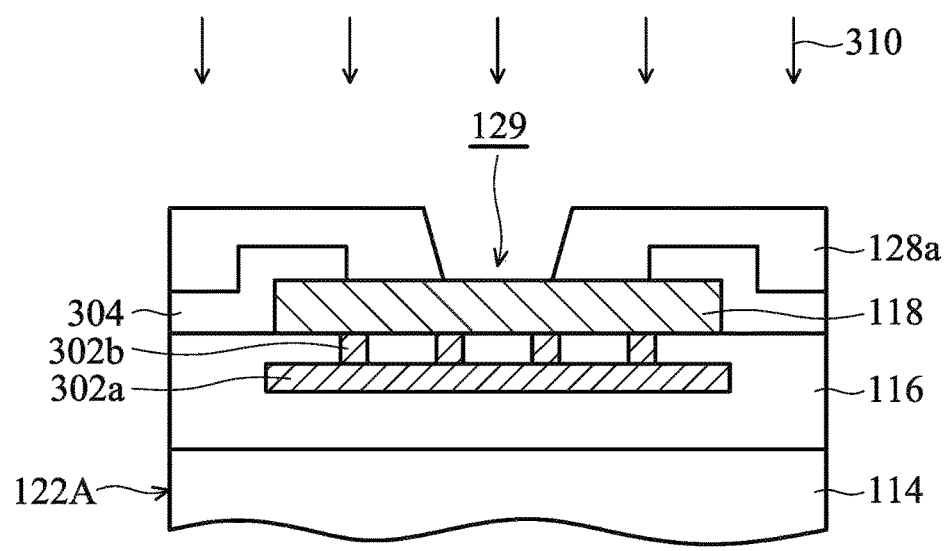

As shown in FIG. 3D, a plasma treatment 310 is used to further clean the surfaces of the conductive features 118, in accordance with some embodiments. The plasma treatment 310 may also be used to clean the surfaces of the conductive structures 112A-112D. In some embodiments, the reaction gas used in the plasma treatment 310 includes nitrogen gas, argon gas, another suitable gas, or a combination thereof.

Many variations and/or modifications can be made to embodiments of the disclosure. In some other embodiments, the plasma treatment 310 is not used.

Figure 3E:
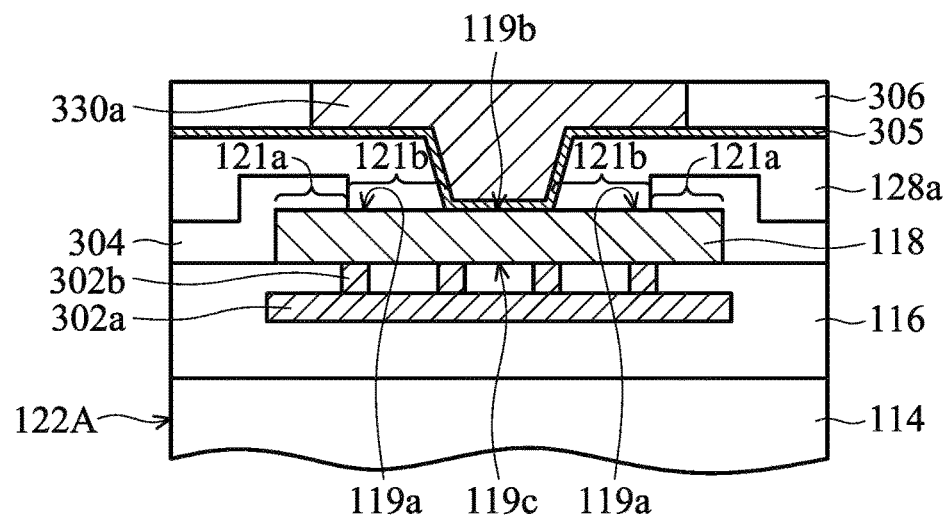

As shown in FIG. 3E, a seed layer 305 is deposited over the dielectric layer 128a and the conductive feature 118, in accordance with some embodiments. In some embodiments, the seed layer 305 is also deposited on the surfaces of the conductive structures 112A-112D. In some embodiments, the seed layer 305 is made of Ti, Ti alloy, Cu, Cu alloy, another suitable material, or a combination thereof. In some embodiments, the seed layer 305 includes multiple sub-layers. For example, the seed layer 305 includes a Ti layer and a Cu layer. The Ti layer may be between the Cu layer and the conductive feature 118.

In some embodiments, the seed layer 305 is deposited using a sputtering process or another applicable process. In some embodiments, the seed layer 305 is in-situ deposited in the same process chamber after the plasma treatment 310 is performed. That is, the structure shown in FIG. 3D is not taken away from the process chamber before the seed layer 305 is formed. Therefore, the cleaned surfaces of the conductive features 118 and the conductive structures 112A-112D are prevented from being polluted.

Afterwards, a mask layer 306 is formed over the seed layer 305, as shown in FIG. 3E in accordance with some embodiments. The mask layer 306 has one or more openings that define positions where the conductive layers 130a will be formed. The mask layer 306 is, for example, a patterned photoresist layer. In some embodiments, a plating process is used to form a conductive material 330a on the exposed portions of the seed layer 305.

Afterwards, the mask layer 306 may be removed. An etching process may be used to remove the portions of the seed layer 305 that were covered by the mask layer 306. As a result, the seed layer 305 and the plated conductive material 330a are patterned to form the conductive layers 130a, as shown in FIG. 1F. Each of the conductive layers 130a may include a portion of the seed layer 305 and a portion of the conductive material 330a plated thereon.

Figure 7:
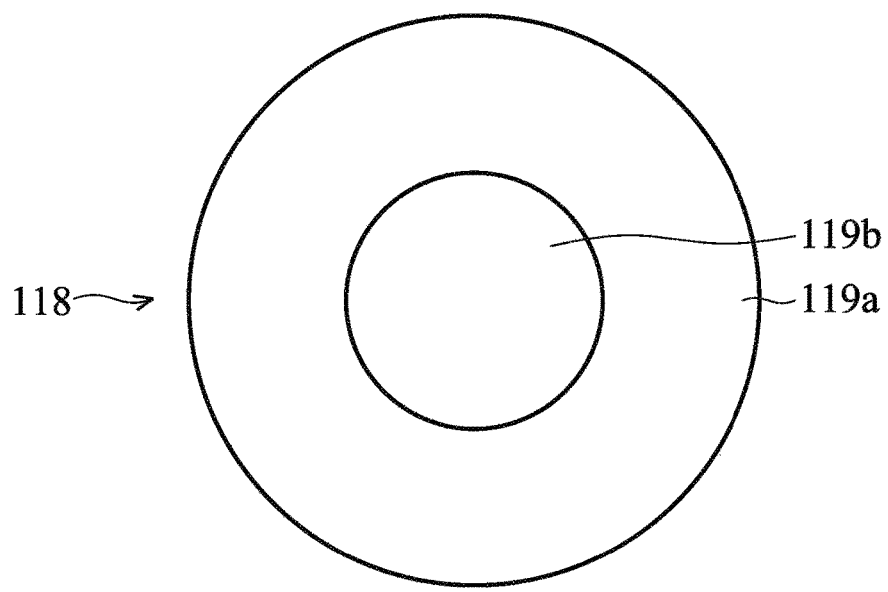
FIG. 7 is a top view of a conductive pad of a chip package, in accordance with some embodiments.

As shown in FIG. 3E, the conductive feature 118 has a first portion 119a that is directly below the dielectric layer 128a. The conductive feature 118 also has a second portion 119b that is surrounded by the first portion 119a. In some embodiments, the second portion 119b is in direct contact with the conductive layers 130a, as shown in FIGS. 3E and 1F. FIG. 7 is a top view of a conductive feature (such as a conductive pad) of a chip package, in accordance with some embodiments. In some embodiments, FIG. 7 is a top view of the conductive feature 118 shown in FIG. 3E. In some embodiments, the first portion 119a continuously surrounds the second portion 119b.

The second portion 119b corresponds to the portion of the conductive feature 118 that is treated with the cleaning operation 308. The first portion 119a that is covered by the dielectric layer 128a is not treated with the cleaning operation 308. In some embodiments, due to the cleaning operation 308, the second portion 119b has a surface roughness greater than that of the first portion 119a.

As shown in FIG. 3E, the first portion 119a has a first region 121a and a second region 121b. The first region 121a is directly below and covered by the passivation layer 304. The second region 121b is covered by the dielectric layer 128a without being covered by the passivation layer 304. In some embodiments, the second portion 119b has a surface roughness greater than that of the first region 121a or the second region 121b of the first portion 119a.

An atomic force microscope (AFM) may be used to measure the surface roughness of the conductive feature 118. In some embodiments, the first portion 119a, that is not treated with the cleaning operation 308, has a surface roughness less than about 50 nm. In some embodiments, the second portion 119b, that has been treated with the cleaning operation 308, has a surface roughness in a range from about 70 nm to about 150 nm. In some other embodiments, the second portion 119b has a surface roughness that is in a range from about 80 nm to about 130 nm.

In some embodiments, an average depth of grain boundaries of the second portion 119b is greater than an average depth of grain boundaries of the first portion 119a. In some embodiments, the average depth of grain boundaries of the second portion 119b is in a range from about 110 nm to about 150 nm.

As shown in FIG. 3E, the conductive feature 118 also has a third portion 119c that is opposite to the second portion 119b. Similar to the first portion 119a, the third portion 119c is not treated with the cleaning operation 308. In some embodiments, the surface roughness of the second portion 119b is greater than that of the third portion 119c. In some embodiments, the average depth of grain boundaries of the second portion 119b is greater than that of the third portion 119c.

Similar to the conductive feature 118, the conductive structure 112A has a first region 113a covered by the dielectric layer 128a and a second region 113b not covered by the dielectric layer 128a, as shown in FIG. 1E. One of the openings 129 exposes the second region 113b of the conductive structure 112A. The second region 113B is treated with the cleaning operation 308, and the first region 113A is not treated with the cleaning operation 308, as shown in FIG. 1E in accordance with some embodiments. In some embodiments, the surface roughness of the second region 113b is greater than that of the first region 113a. In some embodiments, the average depth of grain boundaries of the second region 113b is greater than that of the first region 113a.

Figure 1G:
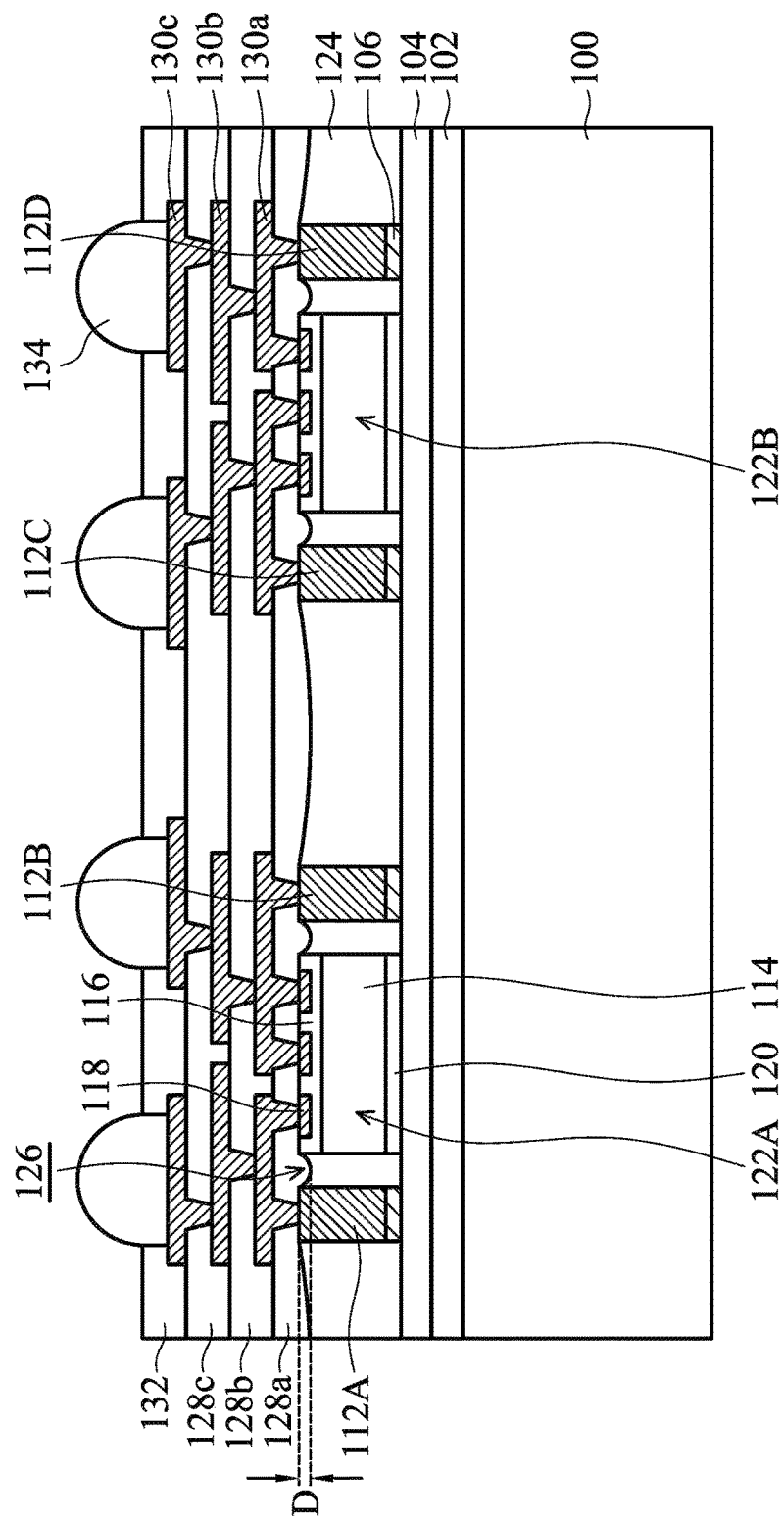

Referring to FIG. 1G, a dielectric layer 128b is formed over the dielectric layer 128a and the conductive layers 130a, in accordance with some embodiments. In some embodiments, the material and formation method of the dielectric layer 128b is the same as or similar to those of the dielectric layer 128a. However, embodiments of the disclosure are not limited thereto. In some other embodiments, the dielectric layer 128b is made of a dielectric material different from that of the dielectric layer 128a. In some embodiments, the dielectric layer 128b is made of silicon oxide or the like using a deposition process, such as a chemical vapor deposition (CVD) process.

Afterwards, multiple dielectric layers including a dielectric layer 128c and a passivation layer 132 and multiple conductive layers including conductive layers 130b and 130c are formed, as shown in FIG. 1G in accordance with some embodiments. In some embodiments, conductive bumps 134 are formed. An under bump metallurgy (UBM) layer (not shown) may be formed between the conductive bumps 134 and the conductive layers 130c.

Afterwards, the structure shown in FIG. 1G is placed upside down, and the carrier substrate 100 and adhesive layer 102 are removed, in accordance with some embodiments. Afterwards, a dicing process is performed to separate the structure as shown in FIG. 1G into multiple chip packages, as shown in FIG. 1I in accordance with some embodiments. As a result, a chip package with a fan-out structure is formed.

Figure 1H:
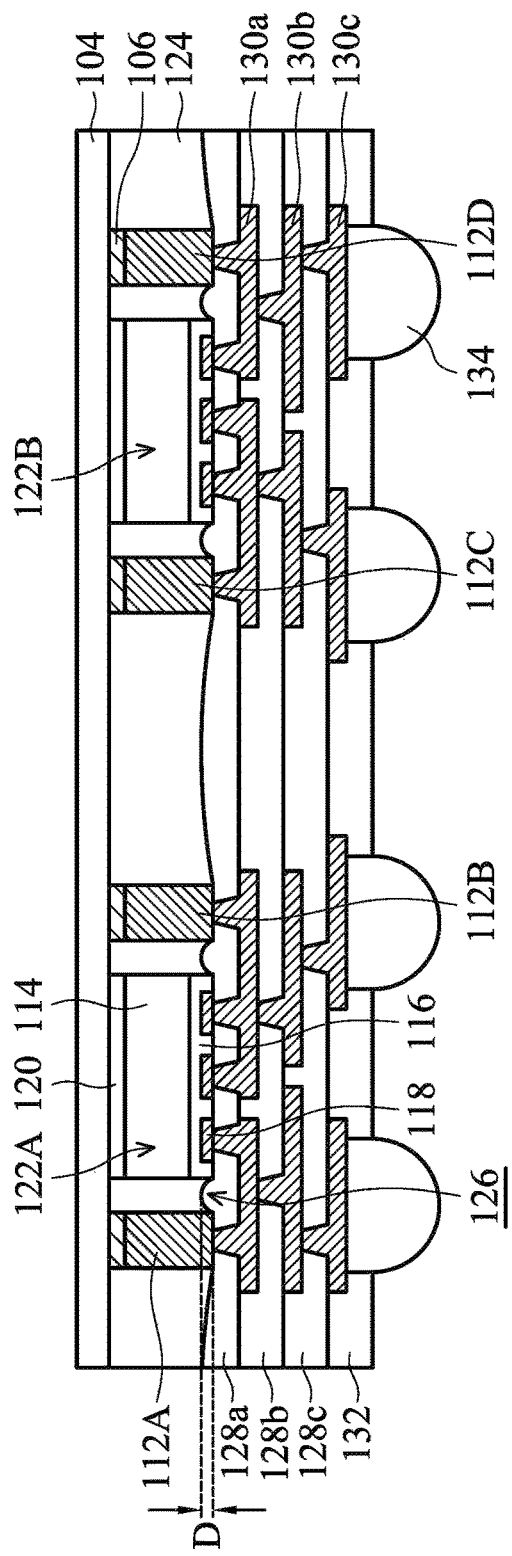
Figure 1I:
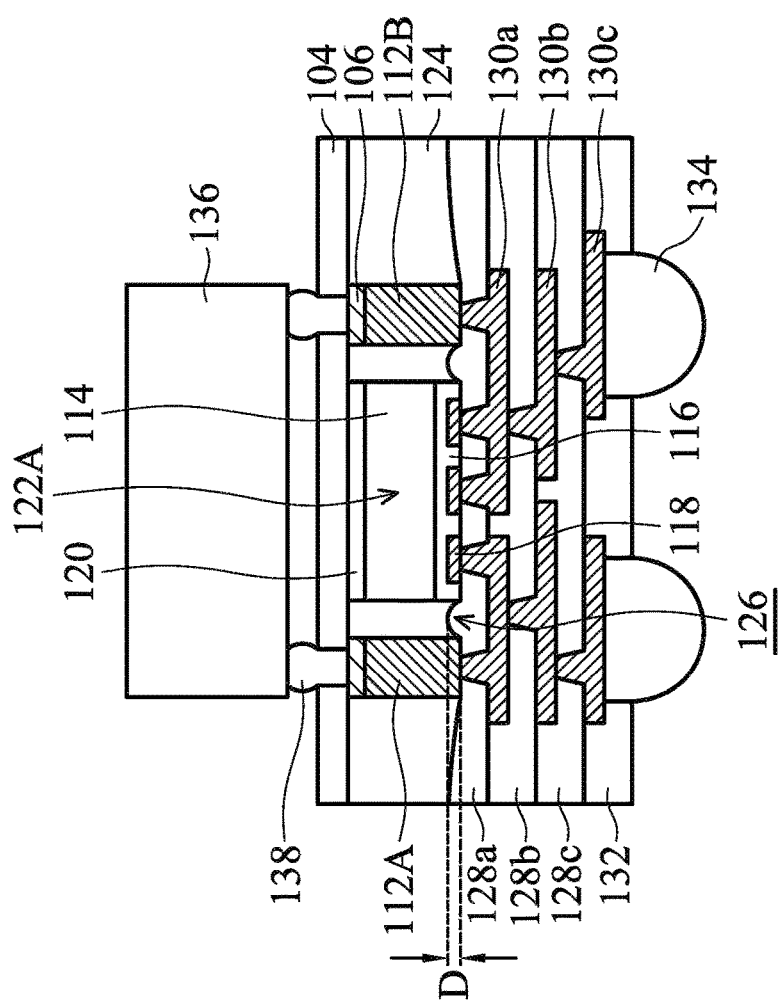

In some embodiments, one or more elements are stacked on or bonded onto the structure as shown in FIG. 1H before the dicing process. As shown in FIG. 1I, another element 136 is stacked over chip package, in accordance with some embodiments. The element 136 may include a chip package, a semiconductor die, one or more passive devices, another suitable structure, or a combination thereof.

In some embodiments, conductive connectors 138 are formed between the element 136 and the conductive structures such as the conductive structures 112A and 112B. Electrical connections between the element 136 and the semiconductor die 122A may therefore be established. In some embodiments, the base layer 104 is patterned to form openings that expose the seed layer 106 connecting the conductive structures 112A and 112B. The conductive connectors 138 may be formed in the openings and electrically connected to other conductive features of the element 136. In some embodiments, the conductive connectors include solder bumps, solder balls, conductive pillars, conductive pillars that contain no tin, another suitable structure, or a combination thereof.

Many variations and/or modifications can be made to embodiments of the disclosure. In some embodiments, the element 136 is stacked before the dicing process. In some other embodiments, the element 136 is stacked after the dicing process.

In the embodiments illustrated in FIGS. 3A-3E, the surface of the conductive feature 118 is cleaned with the acid-containing substance in the cleaning operation 308 after the dielectric layer 128a is formed. However, embodiments of the disclosure are not limited thereto. In some other embodiments, the surface of the conductive feature 118 is cleaned with the acid-containing substance before the dielectric layer 128a is formed.

Figure 4A:
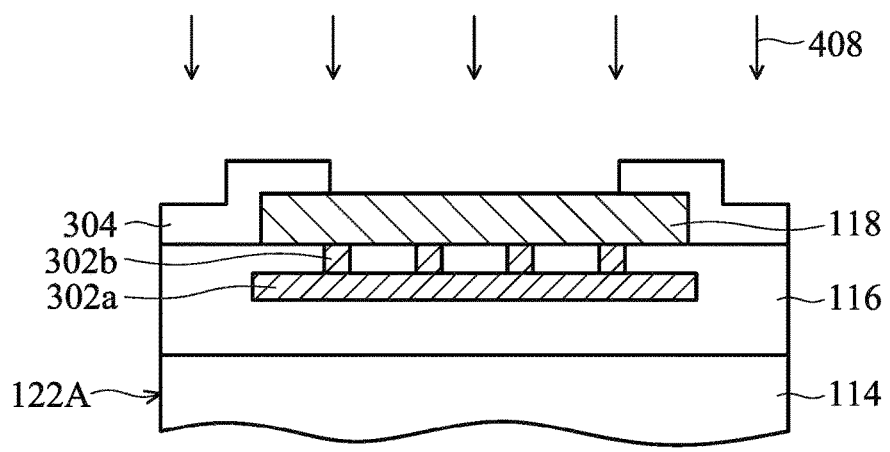
FIGS. 4A-4D are cross-sectional views of various stages of a process for forming a chip package, in accordance with some embodiments.
Figure 4B:
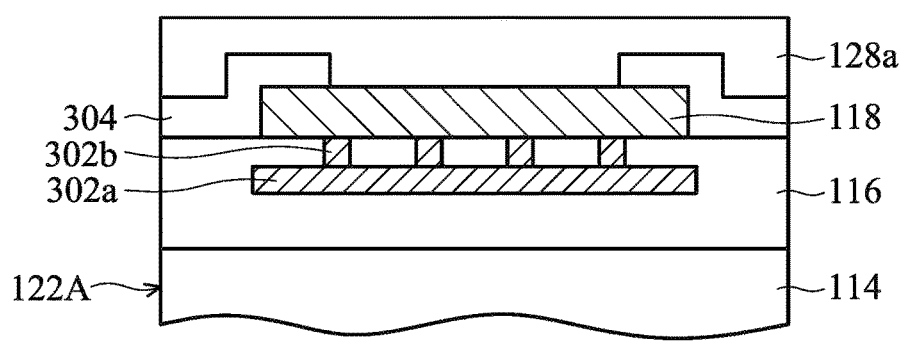

FIGS. 4A-4D are cross-sectional views of various stages of a process for forming a chip package, in accordance with some embodiments. As shown in FIGS. 4A and 4B, a cleaning operation 408 is used to clean the surface of the conductive feature 118 before the dielectric layer 128a is formed. The cleaning operation 408 may be the same as or similar to the cleaning operation 308.

Figure 4C:
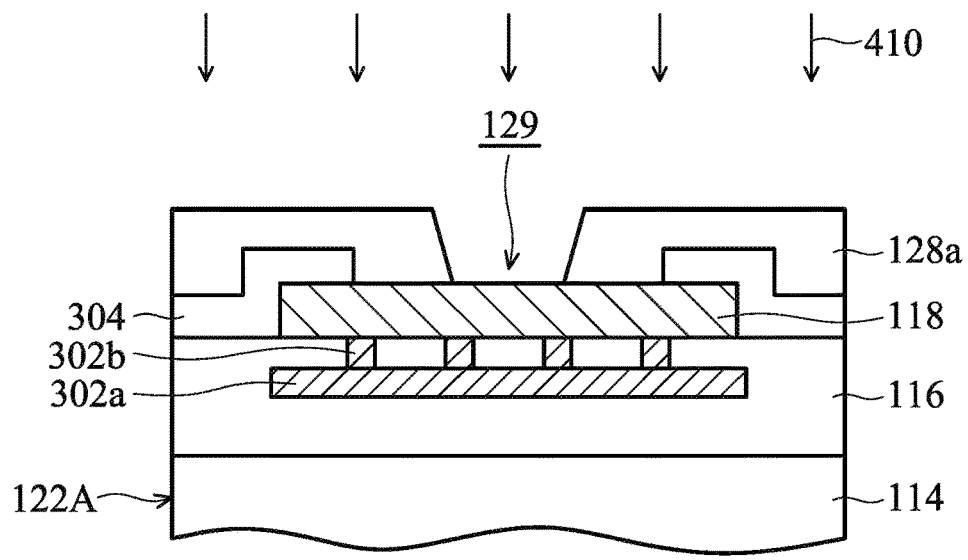

Afterwards, the dielectric layer 128a is patterned to form the opening 129 that exposes the conductive feature 118, as shown in FIG. 4C in accordance with some embodiments. In some embodiments, a plasma treatment 410 is used to further clean the exposed surface the conductive feature 118. The plasma treatment 410 may be the same as or similar to the plasma treatment 310.

Figure 4D:
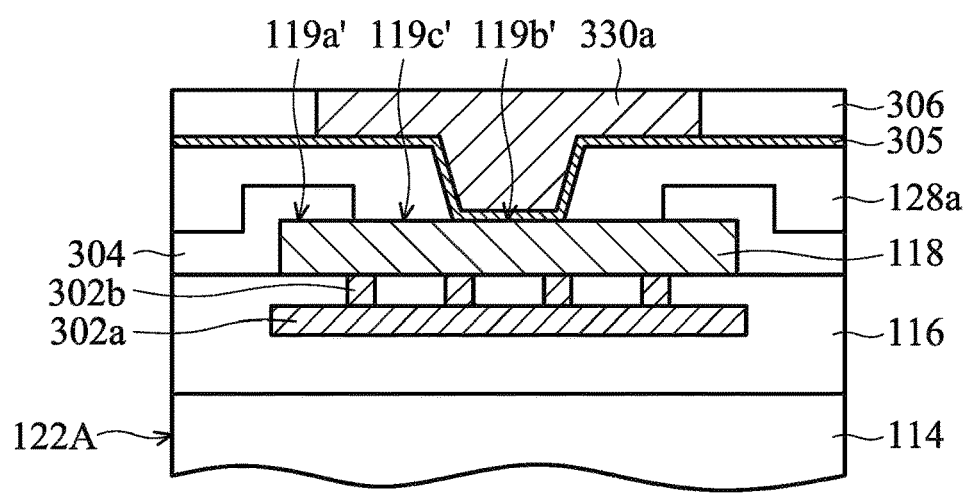

Afterwards, similar to the embodiments illustrated in FIG. 3E, the seed layer 305, the mask layer 306, and the conductive material 330a are formed, as shown in FIG. 4D in accordance with some embodiments. Afterwards, the mask layer 306 is removed, and an etching process is used to remove the portions of the seed layer 305 that were covered by the mask layer 306. As a result, the seed layer 305 and the plated conductive material 330a are patterned to form the conductive layers 130a, as shown in FIG. 1F.

In the embodiments illustrated in FIGS. 4A-4D, the cleaning operation 408 is performed before the formation of the dielectric layer 128a. For example, the cleaning operation 408 is performed at the process stage illustrated in FIG. 1D. Therefore, in some embodiments, the entire top surfaces of the conductive structures 112A-112D are treated with the cleaning operation 408. The surface roughness of different regions of each of the conductive structures 112A-112D may be substantially the same. The average depth of grain boundaries of different regions of each of the conductive structures 112A-112D may be substantially the same.

As shown in FIG. 4D, the conductive feature 118 has a first portion 119a' that is directly below the passivation layer 304 or covered by the passivation layer 304. The conductive feature 118 also has a second portion 119b' and a third portion 119c'. The third portion 119c' is covered by the dielectric layer 128a without being covered by the passivation layer 304. The second portion 119b' is not directly below or covered by the passivation layer 304 or the dielectric layer 128a. In some embodiments, the second portion 119b' is surrounded by the first portion 119a' and the third portion 119c'. In some embodiments, the second portion 119b' is in direct contact with the conductive layers 130a, as shown in FIGS. 4D and 1F.

As shown in FIGS. 4A and 4C, both the second portion 119b' and the third portion 119c' correspond to the portion of the conductive feature 118 that is treated with the cleaning operation 308. The first portion 119a' that is covered by the passivation layer 304 is not treated with the cleaning operation 308. In some embodiments, due to the cleaning operation 308, the portion of the conductive feature 118 that is not covered by the passivation layer 304 has a surface roughness greater than that of the first portion 119a'. That is, each of the second portion 119b' and the third portion 119c' has a surface roughness greater than that of the first portion 119a'. In some embodiments, the surface roughness of the second portion 119b' is substantially the same as that of the third portion 119c' since each of the second portion 119b' and the third portion 119c' is treated with the cleaning operation 408.

An atomic force microscope (AFM) may be used to measure the surface roughness of the conductive feature 118. In some embodiments, the first portion 119a' has a surface roughness less than about 50 nm. In some embodiments, each of the second portion 119b' and the third portion 119c' has a surface roughness in a range from about 70 nm to about 150 nm. In some other embodiments, each of the second portion 119b' and the third portion 119c' has a surface roughness that is in a range from about 80 nm to about 130 nm.

In some embodiments, an average depth of grain boundaries of the second portion 119b' or the third portion 119c' is greater than an average depth of grain boundaries of the first portion 119a'. In some embodiments, the average depth of grain boundaries of the second portion 119b' or the third portion 119c' is in a range from about 110 nm to about 150 nm.

Embodiments of the disclosure form a chip package having a semiconductor die surrounded by a protection layer. A mold is used to assist in the formation of the protection layer. The protection layer may not need to be thinned to expose conductive pads of the semiconductor die. Fabrication cost and process time are significantly reduced. Damage due to the thinning process may also be prevented. An acid-containing substance is applied on the conductive pads to remove residues formed on the conductive pads during formation of the protection layer. Therefore, electrical connection between the cleaned conductive pads and subsequently formed conductive layers are improved.

In accordance with some embodiments, a chip package is provided. The chip package includes a semiconductor die having a conductive feature and a protection layer surrounding the semiconductor die. The chip package also includes a dielectric layer arranged over the semiconductor die and the protection layer and partially covering the conductive feature. The conductive feature is arranged accessibly from the protection layer and the dielectric layer. The chip package further includes a conductive layer penetrating through the dielectric layer and electrically connected to the conductive feature of the semiconductor die. The conductive feature has a first portion covered by the dielectric layer and a second portion accessibly exposed from the dielectric layer, and the second portion has a surface roughness greater than that of the first portion.

In accordance with some embodiments, a chip package is provided. The chip package includes a semiconductor die having a conductive feature and a passivation layer. The conductive feature has a first portion covered by the passivation layer and a second portion accessibly exposed from the passivation layer. The second portion has a surface grain boundary depth greater than that of the first portion. The chip package also includes a protection layer surrounding the semiconductor die and a dielectric layer over the semiconductor die and the protection layer. The chip package further includes a conductive layer penetrating through the dielectric layer and electrically connected to the conductive feature of the semiconductor die.

In accordance with some embodiments, a method for forming a chip package is provided. The method includes forming a molding compound layer to surround a semiconductor die, and the semiconductor die has a conductive pad exposed from the molding compound layer. The method also includes forming a dielectric layer over the molding compound layer and the semiconductor die, and the conductive pad is accessibly exposed from the dielectric layer. The method further includes performing a treatment on an exposed surface of the conductive pad to increase a surface roughness of the conductive pad. In addition, the method includes forming a conductive layer over the dielectric layer such that the conductive layer is electrically connected to the conductive pad.

In accordance with some embodiments, a chip package is provided. The chip package includes a semiconductor die having a conductive feature and a protection layer surrounding the semiconductor die. The chip package also includes a dielectric layer over the semiconductor die and the protection layer. The chip package further includes a conductive layer penetrating through the dielectric layer and electrically connected to the conductive feature of the semiconductor die. The conductive feature has a first portion directly below the dielectric layer and a second portion surrounded by the first portion. The second portion has a surface roughness greater than that of the first portion.

In accordance with some embodiments, a chip package is provided. The chip package includes a semiconductor die having a conductive feature and a passivation layer. The conductive feature has a first portion covered by the passivation layer and a second portion not covered by the passivation layer. The second portion has a surface roughness greater than that of the first portion. The chip package also includes a protection layer surrounding the semiconductor die and a dielectric layer over the semiconductor die and the protection layer. The chip package further includes a conductive layer penetrating through the dielectric layer and electrically connected to the conductive feature of the semiconductor die.

In accordance with some embodiments, a method for forming a chip package is provided. The method includes forming a molding compound layer to surround a semiconductor die, and the semiconductor die has a conductive pad. The method also includes forming a dielectric layer over the molding compound layer and the semiconductor die. The method further includes forming a conductive layer over the dielectric layer such that the conductive layer is electrically connected to the conductive pad. In addition, the method includes cleaning a surface of the conductive pad by an acid-containing substance after forming the molding compound layer and before forming the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package, comprising:
   forming a molding compound layer to surround a semiconductor die, wherein the semiconductor die has a conductive pad exposed from the molding compound layer;
   forming a dielectric layer over the molding compound layer and the semiconductor die, wherein the conductive pad is accessibly exposed from the dielectric layer;
   performing a treatment on an exposed surface of the conductive pad to increase a surface roughness of the conductive pad;
   forming a conductive layer over the dielectric layer such that the conductive layer is electrically connected to the conductive pad;
   placing the semiconductor die over a carrier substrate before the molding compound layer is formed;
   forming a conductive structure over the carrier substrate before the molding compound layer is formed, wherein the conductive structure and the semiconductor die are separated from each other; and
   removing the carrier substrate after the molding compound layer is formed.

2. The method for forming a chip package as claimed in claim 1, wherein the treatment comprises applying an acid-containing substance on the exposed surface of the conductive pad, and the acid-containing substance comprises a hydrofluoric acid solution.

3. The method for forming a chip package as claimed in claim 1, further comprising:
   disposing a mold over the semiconductor die;
   injecting a molding compound material into the mold to surround the semiconductor die;
   curing the molding compound material to form the molding compound layer; and
   removing the mold.

4. The method for forming a chip package as claimed in claim 1, wherein the treatment comprises applying an acid-containing substance on the exposed surface of the conductive pad such that a surface grain boundary depth of the exposed surface of the conductive pad is increased to be no less than about 110 nm, and the surface of the conductive pad is cleaned with the acid-containing substance after forming the dielectric layer.

5. The method for forming a chip package as claimed in claim 1, wherein the treatment comprises applying an acid-containing substance on the exposed surface of the conductive pad such that a surface roughness of the exposed surface of the conductive pad is increased to be no less than about 70 nm, and the surface of the conductive pad is cleaned with the acid-containing substance before forming the dielectric layer.

6. The method for forming a chip package as claimed in claim 3, wherein the mold comprises a release film, and the release film is in direct contact with the semiconductor die during the injecting of the molding compound material.

7. The method for forming a chip package as claimed in claim 1, wherein the treatment comprises applying an acid-containing substance on the exposed surface of the conductive pad, and the acid-containing substance comprises a phosphoric acid solution, an HF gas, or a combination thereof.

8. The method for forming a chip package as claimed in claim 1, further comprising performing a plasma treatment on the exposed surface of the conductive pad after the treatment and before the formation of the conductive layer.

9. The method for forming a chip package as claimed in claim 1, wherein the treatment is performed on the exposed surface of the conductive pad after forming the dielectric layer.

10. The method for forming a chip package as claimed in claim 1, wherein the treatment is performed on the exposed surface of the conductive pad before forming the dielectric layer.

11. A method for forming a chip package, comprising:
    forming a protection layer to surround a semiconductor die, wherein the semiconductor die has a conductive pad;
    forming a dielectric layer over the protection layer and the semiconductor die;
    forming a conductive layer over the dielectric layer such that the conductive layer is electrically connected to the conductive pad;
    cleaning a surface of the conductive pad by an acid-containing substance after forming the protection layer and before forming the conductive layer;
    placing the semiconductor die over a carrier substrate before the protection layer is formed;
    forming a conductive structure over the carrier substrate before the protection layer is formed, wherein the conductive structure is next to the semiconductor die, and the conductive structure is substantially as high as the semiconductor die; and
    cleaning a surface of the conductive structure by the acid-containing substance after forming the protection layer and before forming the conductive layer.

12. The method for forming a chip package as claimed in claim 11, further comprising:
    disposing a mold over the semiconductor die;
    injecting a molding compound material into the mold to surround the semiconductor die;
    curing the molding compound material to form the protection layer; and
    removing the mold.

13. The method for forming a chip package as claimed in claim 12, wherein the mold comprises a release film, and the release film is in direct contact with the semiconductor die during the injecting of the molding compound material.

14. The method for forming a chip package as claimed in claim 11, wherein the cleaning of the surface of the conductive structure and the cleaning of the surface of the conductive pad are performed simultaneously after forming the dielectric layer.

15. A method for forming a chip package, comprising:
  forming a protection layer to surround a semiconductor die, wherein the semiconductor die has a conductive pad;
  forming a dielectric layer over the protection layer and the semiconductor die;
  forming an opening in the dielectric layer to expose a portion of the conductive pad;
  applying an acid-containing substance on the portion of the conductive pad exposed by the opening;
  forming a conductive layer on the portion of the conductive pad after applying the acid-containing substance;
  placing the semiconductor die over a carrier substrate before the protection layer is formed;
  forming a conductive structure over the carrier substrate before the protection layer is formed, wherein the conductive structure and the semiconductor die are separated from each other; and
  removing the carrier substrate after the protection layer is formed.

16. The method for forming a chip package as claimed in claim 15, wherein the acid-containing substance comprises hydrofluoric acid solution, an HF gas, a phosphoric acid solution, or a combination thereof.

17. The method for forming a chip package as claimed in claim 15, further comprising:
  disposing a mold over the semiconductor die, wherein the mold comprises a release film;
  injecting a molding compound material into the mold to surround the semiconductor die, wherein the release film is in direct contact with the semiconductor die and the conductive structure during the injecting of the molding compound material;
  curing the molding compound material to form the protection layer; and
  removing the mold.

18. The method for forming a chip package as claimed in claim 17, further comprising:
  forming a second opening in the dielectric layer to expose a portion of the conductive structure; and
  applying the acid-containing substance on the portion of the conductive structure exposed by the second opening.

19. The method for forming a chip package as claimed in claim 1, wherein the dielectric layer comprises one or more polymer materials.

20. The method for forming a chip package as claimed in claim 11, wherein a surface of the conductive pad has an inner portion and an outer portion, the outer portion continuously surrounds the inner portion, and the inner portion has a greater average depth of grain boundaries than that of the outer portion.

* * * * *